United States Patent [19]
Kishi

[11] Patent Number: 5,148,257
[45] Date of Patent: Sep. 15, 1992

[54] SEMICONDUCTOR DEVICE HAVING U-GROOVE

[75] Inventor: Shuji Kishi, Tokyo, Japan
[73] Assignee: NEC Corporation, Tokyo, Japan
[21] Appl. No.: 627,034
[22] Filed: Dec. 13, 1990

[30] Foreign Application Priority Data
Dec. 20, 1989 [JP] Japan .................. 1-332055

[51] Int. Cl.[5] ............................. H01L 27/12
[52] U.S. Cl. .......................... 357/49; 357/55; 357/54; 357/47
[58] Field of Search ............. 357/49, 55, 54, 47, 357/23.11

[56] References Cited

U.S. PATENT DOCUMENTS

| | | | |
|---|---|---|---|
| 4,635,090 | 1/1987 | Tamaki et al. | 357/60 |
| 4,656,497 | 4/1987 | Rogers et al. | 357/23.11 X |
| 4,819,054 | 4/1989 | Kawaji et al. | 357/54 X |
| 4,907,063 | 3/1990 | Okada et al. | 357/54 O |

FOREIGN PATENT DOCUMENTS

| | | |
|---|---|---|
| 0166140 | 1/1988 | European Pat. Off. |
| 0079548 | 5/1984 | Japan |
| 0106133 | 6/1984 | Japan |
| 61-22646 | 1/1986 | Japan |

OTHER PUBLICATIONS

IEDM Technical Digest, Hiroshi Goto et al. "An Isolation Technology for High Performance Bipolar Memories" pp. 58-60, 1982.

*Primary Examiner*—William Mintel
*Assistant Examiner*—Roy Potter
*Attorney, Agent, or Firm*—Laff, Whitesel, Conte & Saret

[57] ABSTRACT

A dielectric isolation region of a bipolar semiconductor device having a U-groove which is covered over the inner surface thereof with an insulating film, and is filled with polysilicon. The surface of the U-groove polysilicon is covered with a silicon nitride film deposited by CVD technique. This structure permits the earlier steps of forming the dielectric isolation region and also the later steps of forming semiconductor elements to be carried out without causing the surface of the U-groove polysilicon to suffer thermal oxidation.

8 Claims, 12 Drawing Sheets

SEMICONDUCTOR DEVICE HAVING U-GROOVE

BACKGROUND OF THE INVENTION

1. Field of the Invention

This invention relates to a semiconductor device and a process for fabricating the same, and more particularly to a bipolar semiconductor device having a dielectric isolation region of a U-groove structure filled with polycrystalline silicon (referred to as "polysilicon" hereinafter), and a process for fabricating the same.

2. Description of the Prior Art

In silicon LSIs (large scale integrated) circuits, a dielectric isolation region is commonly used to isolate electronic elements. There are a number of methods of isolating semiconductor device areas, such as p-n junction isolation, LOCOS method isolation, and U-groove structure isolation which is called as "trench isolation". Recently the LOCOS method isolation and the U-groove structure isolation are the main current. It has been known that U-groove structure requires narrow region for dielectric isolation as compared with LOCOS structure.

Dielectric isolation region of U-groove structure (referred to as "U-groove dielectric isolation region" hereinafter) was reported firstly in IDEM Tech. Digest, pp. 58–60, 1982. Before this report was already known the dielectric isolation region of V-groove structure formed on the major plane (100) of silicon crystal by mesa-etching. In this structure, dielectric breakdown voltage lowers with smaller V-groove width. In order to overcome the disadvantage of dielectric breakdown voltage like this, the aforementioned IDEM report proposed a U-groove dielectric isolation region.

The formation of a dielectric isolation region of a U-groove structure is carried out generally prior to the formation of semiconductor elements. Therefore, the semiconductor elements are seriously affected by the difference in thermal expansion coefficient between material with which the U-groove is filled and silicon substrate. The U-groove structures are divided into two types: in one type the U-groove is covered over the inner surface thereof with insulating films and filled with polysilicon which is extensively used for dielectric isolation in bipolar transistors. In the other type the U-groove is filled with a dielectric such as BPSG which is used mainly for dielectric isolation in MOS transistors.

In the first type structure, the surface of the polysilicon inside the U-groove is covered with an insulating film. The following specification will describe two recent examples: one is described in a Japanese Patent Laid-Open Application No. Sho. 61-22646; opened on Jan. 31, 1986. This application is presented to solve degradation of the properties of the semiconductor elements due to the stress at the upper edge of the U-groove. In this laid-open specification, a silicon oxide film deposited by a CVD process is used as the insulating film covering the surface of the polysilicon inside the U-groove (referred to as "U-groove polysilicon" hereinafter). Besides, two insulating films are formed covering the inner surface of the U-groove: a silicon oxide film being formed by thermal oxidation (referred to as "thermal-oxidation silicon oxide film" hereinafter) as the first layer, and a silicon oxide film being formed by the CVD process (referred to as "CVD silicon oxide film" hereinafter) as the second film. As the second layer film, other insulating films may be used, such as silicon nitride film, deposited by the CVD technique.

The other example of the first structure is disclosed in a U.S. Pat. No. 4,635,090; published on Jan. 6, 1987, which likewise provides a Y-groove structure for solving the degradation of the characteristics due to stress at the upper edge of the U-groove. This U.S. patent states that a silicon oxide film covering the surface of the polysilicon in the Y-groove is formed by a thermal oxidation of the polysilicon. The surface of this silicon oxide film is covered with a silicon nitride film formed by the CVD technique (referred to as "CVD silicon nitride film" hereinafter). Moreover, of the two insulating films, the first is a thermal-oxidation silicon oxide film, and the second is a CVD silicon nitride film both of which are formed over the inner surface of the Y-groove.

In the aforementioned first example, the surface of the U-groove polysilicon is covered with a CVD silicon oxide film. This structure can cause no such stress in the processing steps of forming the dielectric isolation region. In the subsequent steps of forming semiconductor elements, however, the steps of introducing impurities and in addition a processing step for producing a silicon oxide film of a few tens to hundreds nm on the surface of a silicon substrate or a silicon epitaxial layer formed by thermal oxidation are needed for protecting the surface of the silicon substrate of epitaxial layer. This thermal oxidation processing step results in forming a new silicon oxide film over the surface of the U-groove polysilicon, irrespective of the previous presence of the CVD silicon oxide film because $O_2$ gas can pass substantially freely through the CVD silicon oxide film. In the processing steps of the first example for forming semiconductor elements, this thermal oxidation step reflects a volume-expansion (about 1.5 times) in the vicinity of the surface of the U-groove dielectric isolation region, and thus stress will be applied to the upper portion of the U-groove to enlarge it. This stress may induces crystal lattice defects which in turn can cause a leakage current resulting from breakdown of the p-n junction of semi-conductor element.

In the second example above-mentioned, the surface of a polysilicon inside the Y-groove is covered with a first thermal-oxidation silicon oxide film, and with a silicon nitride film formed over the first film. Thus in the proceeding steps of forming semiconductor elements, no stress occurs resulting from the volume expansion of the surface of the dielectric isolation region of Y-groove structure. On the other hand, the upper edge portion of the Y-groove structure is formed by isotropic etching, and thus it has an average slope of more than 45° C. In this structure, as compared with the U-groove structure in the first example, the stress near the upper edge portion is produced when a thermal-oxidation silicon oxide film is formed on the surface of the polysilicon in the Y-groove. This stress is somewhat lowered, but it still amounts to more than 70%.

As described above, with the prior art U-(and Y-groove) structure commonly used in bipolar semiconductor devices, it is considered impossible to greatly reduce the stress produced in the processing steps of forming the dielectric isolation region of semiconductor elements. For example, bipolar semiconductor devices such as ECL RAM are required because the C-E leakage current may be up to 1/10 of the hold current. The presence of a dislocation relating to the emitter region can cause an increase of C-E leakage current. A similar phenomenon may occur in other bipolar semiconductor devices having different circuitries. A general method in the prior art for suppressing the production of C-E leakage current is to take a sufficiently great distance from the dielectric isolation region to emitter region. This is a major impediment against large-scale integration of bipolar semiconductor devices.

SUMMARY OF THE INVENTION

An object of the present invention is to provide a dielectric isolation region of a bipolar semiconductor device and a process for fabricating the same.

Another object of the present invention is to provide a dielectric isolation region of a bipolar semiconductor device, which has a U-groove structure, and a process for fabricating the same.

A further object of the present invention is to provide a dielectric isolation region of a bipolar semiconductor device, which has a U-groove structure with only a substantially negligible stress produced in the processing steps of forming it, and a process for fabricating the same.

A further object of the present invention is to provide a dielectric isolation region of a bipolar semiconductor device, which has a U-groove structure with only a substantially negligible stress in the processing steps for forming semiconductor elements, which follows the formation of it, and a process for fabricating the same.

A further object of the present invention is to provide a dielectric isolation region of a bipolar semiconductor device, which has a U-groove structure generating minimized leakage current, and a process for fabricating the same.

A further object of the present invention is to provide a dielectric isolation region of a bipolar semiconductor device, which has a U-groove structure suitable for large-scale integration.

In the first embodiment of the present invention, a dielectric isolation region of a semiconductor device, which has a U-groove structure, comprises a U-groove formed in a semiconductor substrate including a silicon substrate and a silicon epitaxial layer. The U-groove is covered over the inner surface thereof with two insulating layers preferably of a thermal-oxidation silicon oxide film and a CVD silicon nitride film and is filled with polysilicon having a surface which is covered with a silicon nitride film. The process for fabricating a semiconductor device of the first embodiment of the present invention comprises a series of steps for forming a U-groove on a semiconductor substrate including a silicon substrate and a silicon epitaxial layer, covering the inner surface of the U-groove with insulating films, filling the U-groove with polysilicon and forming a silicon nitride film covering the surface of the U-groove polysilicon.

In the first embodiment of the present invention, the earlier processing steps of forming a silicon nitride film covering the surface of the polysilicon inside the U-groove dielectric isolation region and also the subsequent steps of forming semiconductor elements can be carried out without causing a volume expansion associated with thermal oxidation of the polysilicon and thus without leakage current due to the resultant stress. This enables a bipolar semiconductor device to be fabricated with a reduced distance between the dielectric isolation region and the emitter region, thus contributing greatly to a large-scale integration of the semiconductor devices.

In the second embodiment of the present invention, the U-groove dielectric isolation region of a semiconductor device has a U-groove formed on a semiconductor substrate comprising a silicon substrate and a silicon epitaxial layer. The U-groove is covered over the inner surface thereof with insulating films and filled with polysilicon to a level which is lower than the upper edge of the U-groove. The upper edge potion of the U-groove and the surface of the U-groove polysilicon are covered with a silicon nitride film. The resultant recess defined by the silicon nitride film is filled with a SOG (spin on glass) film.

The process for fabricating a semiconductor device to which the second embodiment of the present invention is applied comprises a series of steps for forming a U-groove on a semiconductor substrate including a silicon substrate and a silicon epitaxial layer, covering the inner surface of the U-groove with insulating films, filling the U-groove with polysilicon to a level which is lower than the upper edge thereof, forming a silicon nitride film covering the upper edge portion of the U-groove and the surface of the U-groove polysilicon, and filling the the resultant recess defined by the silicon nitride film with a SOG film.

The second embodiment of the present invention has the same effect as the first embodiment and in addition a superior flatness of the surface, thus being markedly advantageous in wiring in the later processing steps.

BRIEF DESCRIPTION OF THE DRAWINGS

The above-mentioned and other objects, features and advantages of this invention will become more apparently by reference to the following detailed description of the invention taken in conjunction with the accompanying drawings, wherein.

DETAILED DESCRIPTION OF THE PREFERRED EMBODIMENTS

Prior to description of the present invention, the prior art will be described with reference to the drawings:

FIGS. 1A through 1E give cross-sectional views schematically illustrating a prior art U-groove dielectric isolation region of a semiconductor device (disclosed in Japanese Patent Laid-Open Application No. Sho. 61-22646; opened on Jan. 31, 1986), and a series of steps for forming it.

Figure 1A:
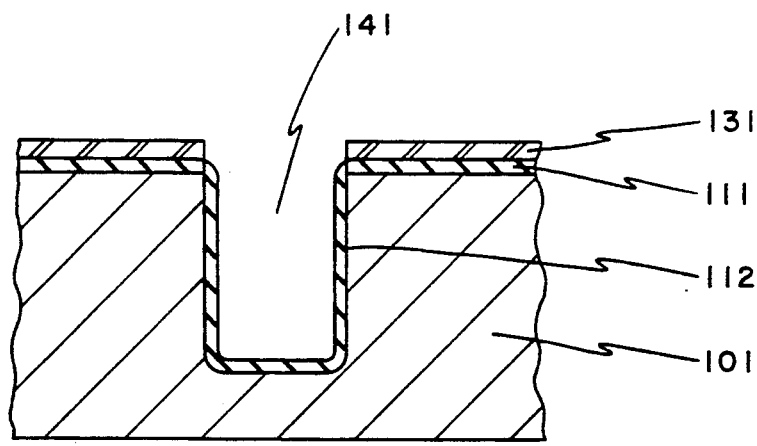
FIGS. 1A through 1E are cross-sectional views schematically illustrating a prior art dielectric isolation region of a semiconductor device, which has a U-groove structure, and a series of steps for forming it.

In the first step, a silicon oxide film 111 is formed to a thickness of about 50 nm over the surface of a silicon substrate 101. Further over the silicon oxide film 111, a silicon nitride film 131 is deposited by a CVD technique, and its thickness is about 100 nm. A window through these films 111, 131, is opened. Using these films as masks, a U-groove 141 is produced on the silicon substrate 101 by the reactive ion etching (referred to as RIE below). The width and depth of the U-groove 141 are about 2 μm and about 3 μm, respectively. Then a silicon oxide film 112 covering the inner surface of the U-groove 141 is formed by the thermal oxidation process using the silicon nitride film 131 as a mask (FIG. 1A). The thickness of the silicon oxide film 112 is 50 nm. The purpose of forming this film is to protect the inner surface of the U-groove 141 from being damaged by etching.

Figure 1B:
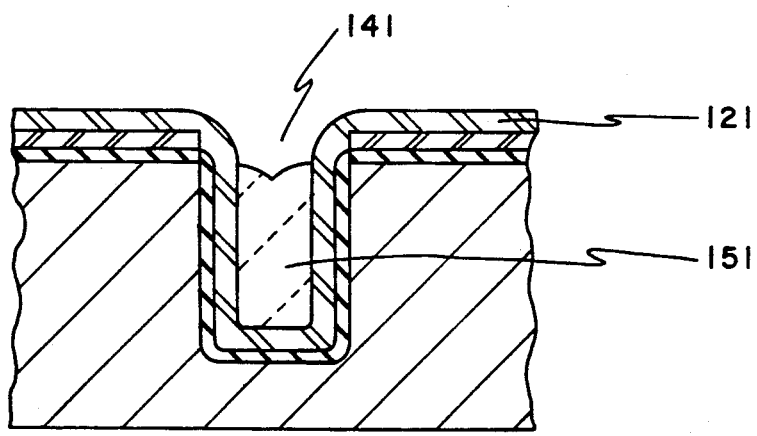

Subsequently a silicon oxide film 121 is deposited by a CVD proc to a thickness of about 300 to 500 nm over the entire surface including the inner surface of U-groove 141. Instead of this CVD silicon oxide film, a silicon nitride film may be deposited by a CVD technique, or a tantalum oxide film may be deposited by the sputtering technique. Subsequently, a polysilicon film is deposited over the entire surface, and etched back by RIE technique. The silicon oxide film 121 is a stopper against the etching. This etching results in filling U-groove 141 with the polysilicon 151 (FIG. 1B).

Figure 1C:
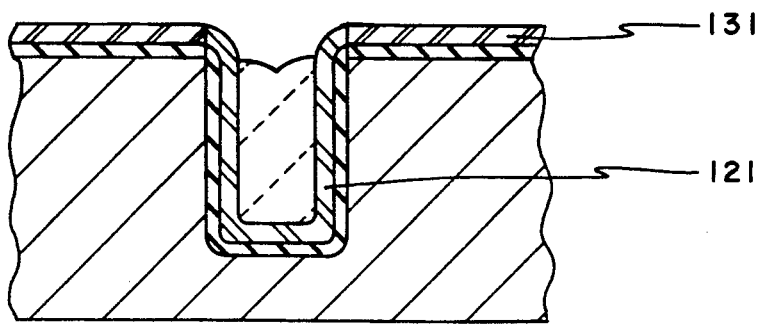

In the succeeding step by the RIE technique, the silicon oxide film 121 is etched back and removed from the top face of the silicon nitride film 131 (FIG. 1C).

Figure 1D:
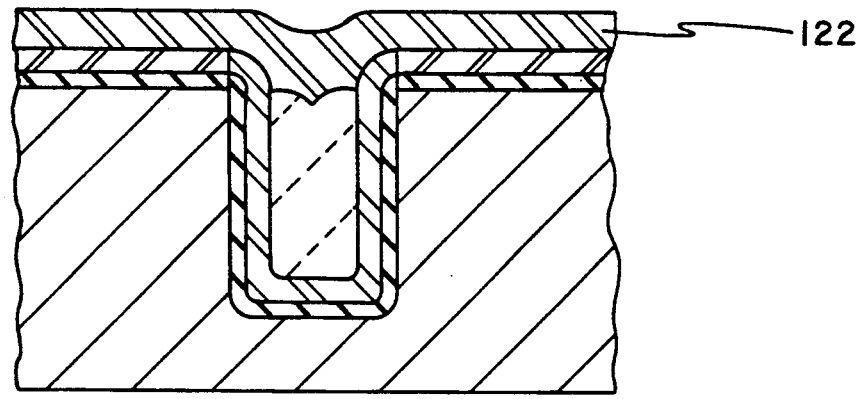
Figure 1E:
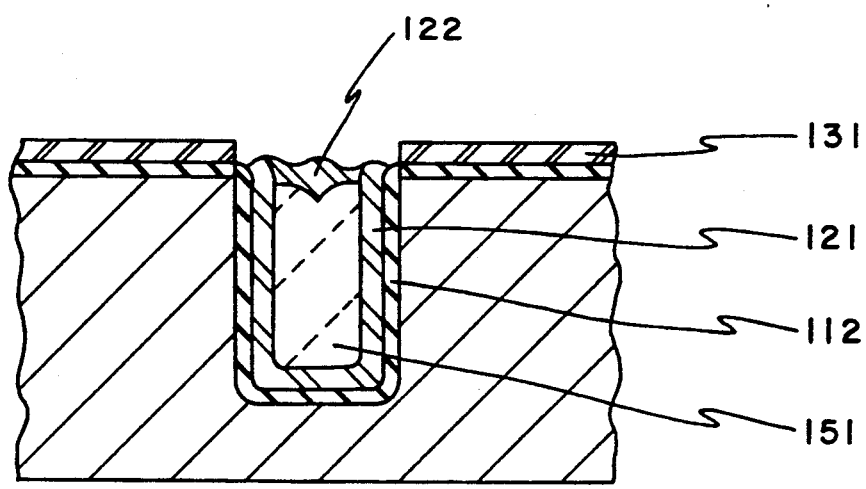

Again a silicon oxide film 122 is deposited over the entire surface by the CVD technique (FIG. 1D). The thickness of the silicon oxide film 122 is about 1 μm.

Subsequently, the silicon oxide film is etched back by the RIE technique (FIG. 1E), and thus a U-groove dielectric isolation region of the semiconductor device is completed. In the last etching back, the silicon nitride film 131 serves as a stopper of unwanted etching.

In the prior art shown in FIG. 1, the U-groove dielectric isolation region of the semiconductor device can be formed without causing a stress associated with volume expansion of the U-groove polysilicon resulting from a thermal oxidation of it. As described above, however, in the subsequent processing steps of forming semiconductor elements, in addition to the steps of doping impurities, a necessary step uses thermal oxidation to form a silicon oxide film of a thickness of tens to hundreds of nm on the surface of a silicon substrate or a silicon epitaxial layer. This, in the structure of the dielectric isolation region according to the prior art shown in FIG. 1, makes it difficult to carrying out the steps of forming semiconductor elements without causing stress.

Figure 2A:
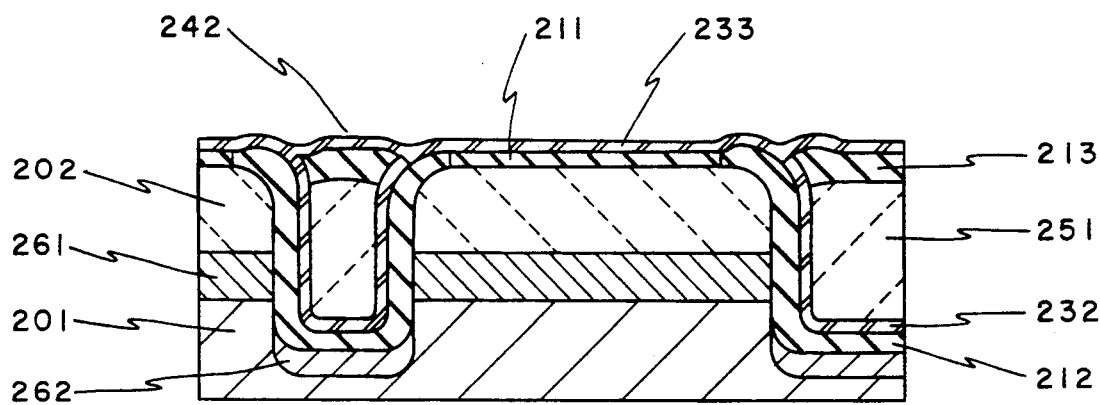
FIGS. 2A and 2B are cross-sectional views schematically illustrating a prior art dielectric isolation region of a bipolar semiconductor device, which has a Y-groove structure, and a series of steps for forming it.
Figure 2B:
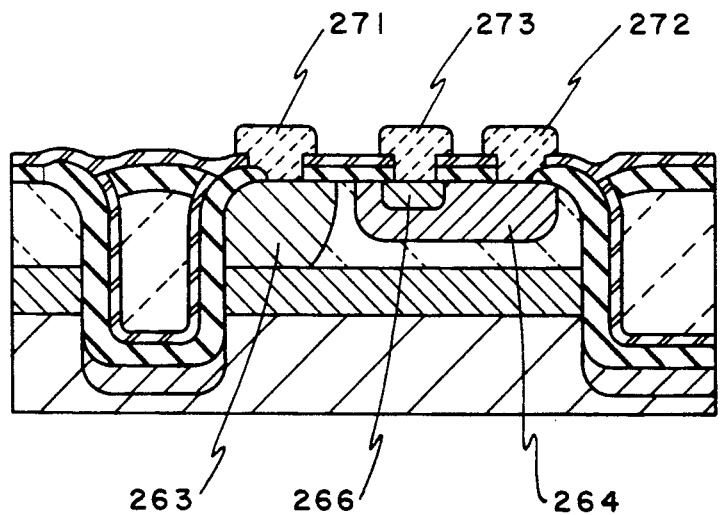

FIGS. 2A and 2B are cross-sectional views schematically illustrating another the prior art structure of a dielectric isolation region of a bipolar semiconductor device having a Y-groove, as disclosed in U.S. Pat. No. 4,635,090, published on Jan. 6, 1987, and a series of steps of forming it.

In the first step, an n+ buried layer 261 is formed on a surface of a p-type silicon body 201. Then over the entire surface, an n-type silicon epitaxial layer 202 is grown. Over this layer 202, a silicon oxide film 211 is formed by thermal oxidation and over this film a silicon nitride film (not shown) is formed by CVD technique. After etching away the silicon nitride film and the silicon oxide film 211 in sequence, with a photoresist film (not shown) used as a mask, the silicon epitaxial layer 202 is subjected to isotropic etching with the silicon nitride film and silicon oxide film 211 used as masks to etch away a part of the silicon epitaxial layer 202, thus the upper portion of the Y-groove being formed. Then, the silicon of the epitaxial layer 202, the buried layer 261 and the silicon body 201 are etched, with the silicon nitride film and silicon oxide film 211 being used as masks, the etching being carried out by the RIE technique in order to form a Y-groove 242.

In the following steps, the inner surface of Y-groove 242 is covered with a silicon oxide film 212 using the silicon nitride film as a mask by using a thermal oxidation. Before or after this processing step, a p-type channel stopper 262 region is formed by ion implantation. The silicon nitride film used as mask is etched away. Over the entire surface including the inner surface of the Y-groove 242, a silicon nitride film 232 is again deposited by a CVD technique. Thereafter, the Y-groove 242 is filled with polysilicon 251 done by the same way as in the prior art shown in FIG. 1. A silicon oxide film 213 is formed on the surface of the U-groove polysilicon 251 by thermal oxidation. Thus a U-groove dielectric isolation region of a bipolar semiconductor device is completed. The silicon nitride 232 exposed on the surface is selectively etched away. Again a silicon nitride film 233 is deposited over the entire surface by a CVD technique (FIG. 2A).

In the subsequent steps, an n+ collector region 263, a p-type base region 264, and an n+ emitter region 266 are formed by a usual photolithography, ion implantation, or diffusion process. A collector electrode 271, a base electrode 272 and an emitter electrode 273 are formed (FIG. 2B).

The prior art shown in FIG. 2, which has a Y-groove structure as described above, fails to completely dissolve the stress resulting from the volume expansion. This stress, about 1.5 times, is associated with the formation of the silicon oxide film 213 on the surface of polysilicon 251.

In the following specification the present invention will be described with reference to the drawings:

FIGS. 3A through 3G are cross-section views schematically illustrating a U-groove dielectric isolation region of a semiconductor device as the first embodiment of the present invention and a series of processing steps for forming it.

Figure 3A:
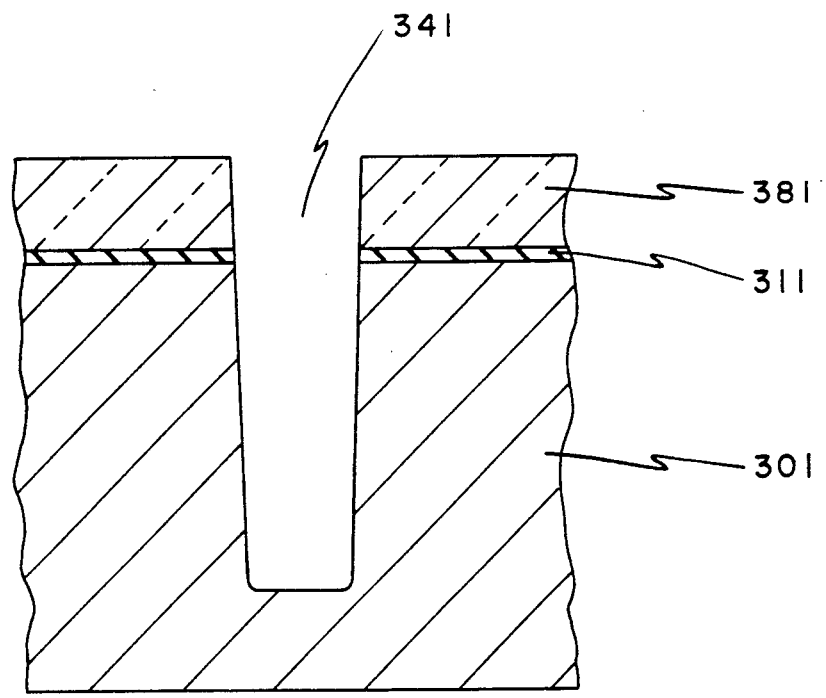
FIGS. 3A through 3G are cross-sectional views schematically illustrating a dielectric isolation region of a semiconductor device, which has a U-groove structure, as the first embodiment of the present invention, and a series of steps for forming it.

In the first step, a silicon oxide film 311 is formed on a silicon substrate 301 by thermal oxidation at 900° C. under a steam atmosphere for 20 minutes. The thickness of the silicon oxide film 311 is about 50 nm. Over the surface of the silicon oxide film 311, a photoresist film 381 having a window of about 1 μm in width is applied. With the photoresist film 381 used as a mask, the silicon oxide film 311 is etched away by the RIE technique using a gas mixture of CF$_4$ and CHF$_3$. Then the silicon substrate 301 is etched to about 5 μm in depth using the photoresist film 381 and the silicon oxide film 311 as masks, and a gas mixture of $SF_6$ and $CCl_2F_2$ by the RIE technique, thereby forming a U-groove 341 (FIG. 3A).

Figure 3B:
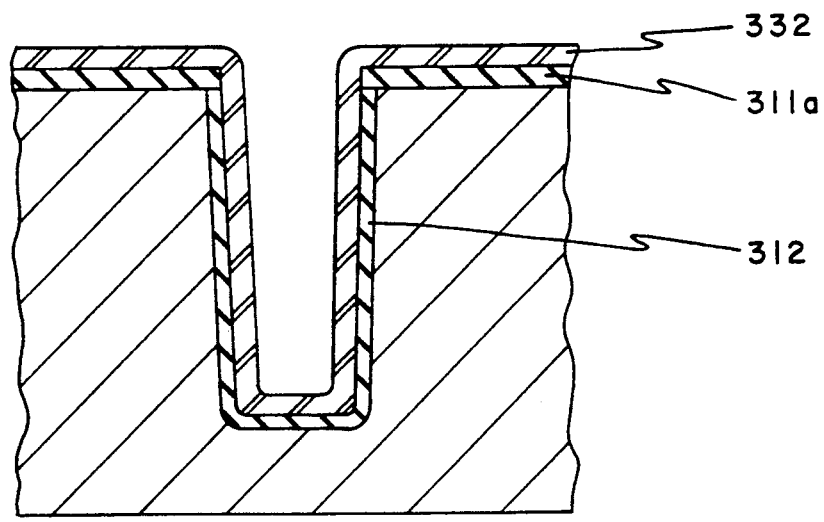

In the following steps, the photoresist film 381 is removed by $O_2$ plasma. The inner surface of the U-groove 341 is covered with a silicon oxide film 312 by thermal oxidation at 900° C. under steam atmosphere, for 20 minutes. The thickness of the silicon oxide film 312 is about 50 nm. Simultaneously the silicon oxide film 311 becomes thicker and is here redesignated 311a. The purpose of forming the silicon oxide 312 is to protect the inner surface of the U-groove 341 from being damaged by later etching. Over the entire surface including the inner surface of the U-groove 341, a silicon nitride film 332 is deposited by a low pressure CVD (LPCVD) technique (FIG. 3B). The thickness of the silicon nitride film 332 is about 100 nm.

Figure 3C:
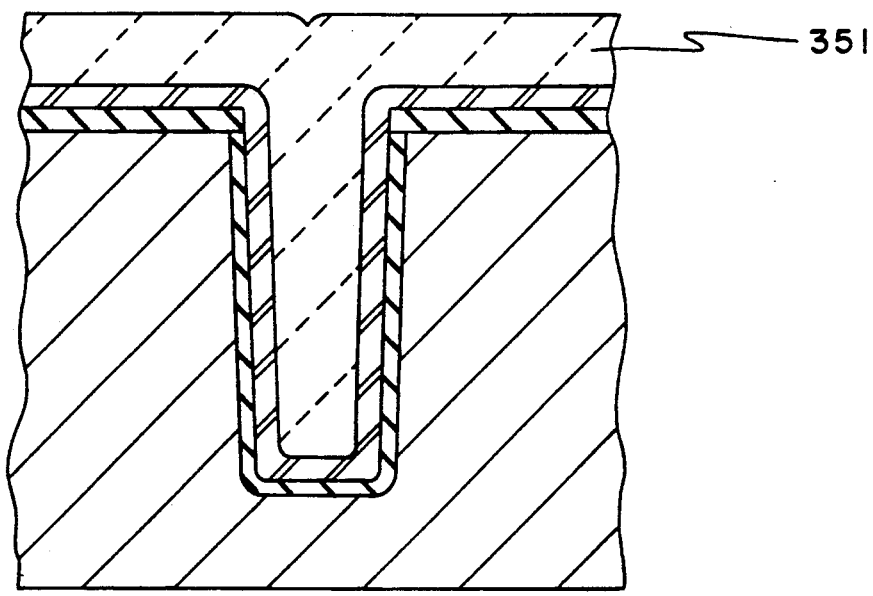

Then a polysilicon layer 351 is deposited by the LPCVD technique, the deposit being over the entire surface (FIG. 3C). The thickness of it is about 1.0 μm.

Figure 3D:
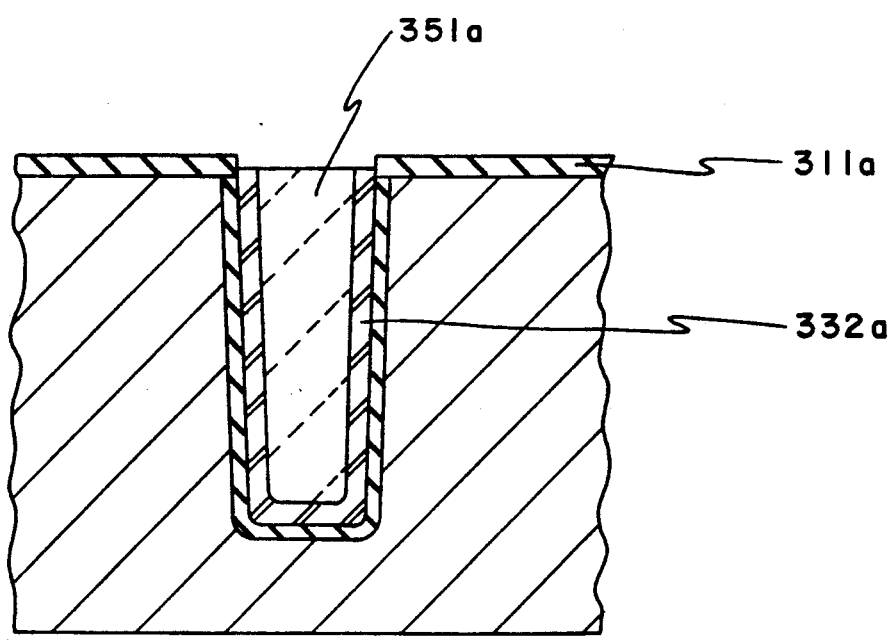

In the following steps, the U-groove 341 is filled with polysilicon 351a by etching the polysilicon layer 351 on the silicon nitride film 332 formed on silicon oxide film 311a, by using a mixed solution of HF, $HNO_3$, $CH_3COOH$. Then the exposed silicon nitride film 332 is etched away to leave a silicon nitride film 332a over only the inner surface of the U-groove 341 by using the RIE technique, or by using the wet etching technique with hot phosphoric acid (FIG. 3D). Besides the etching of the polysilicon layer 351 may be carried out by the RIE technique. The etching of the exposed portions of the silicon nitride film 332 may be carried out at the same time as the etching process of a silicon nitride film deposited in a latter processing step. This, however, is not preferable for the following reasons: In the subsequent steps of forming semiconductor elements, a silicon oxide film of great thickness is provided to become a field insulating film, by using the LOCOS technique. More thermal stress may be produced with an increasing thickness of the silicon nitride film which is used as a mask for thermal oxidation.

Figure 3E:
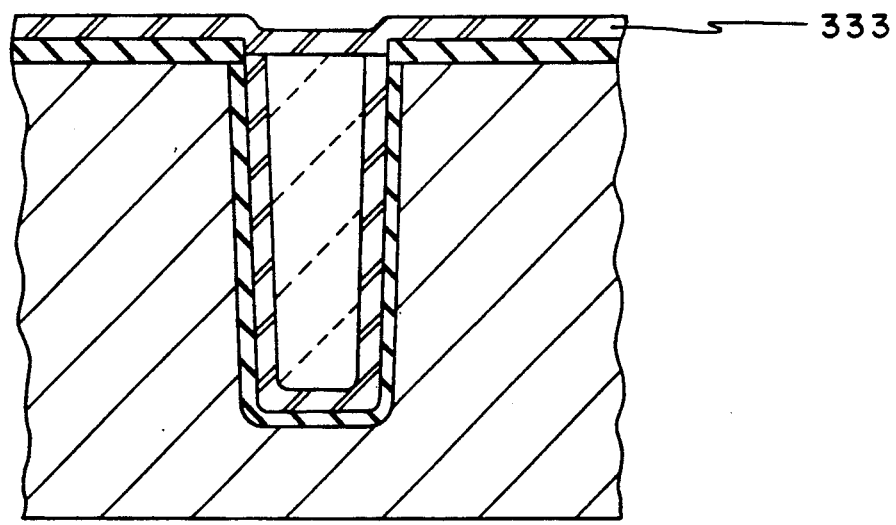

In the next step, a silicon nitride film 333 is deposited over the entire surface including the inner surface of the polysilicon 35a, by using an LPCVD technique so that the silicon nitride film 333 put into direct contact with the upper surface of the polysilicon layer 351 in the U-groove 341 (FIG. 3E). The thickness of the silicon nitride film 333 is about 100 nm.

Figure 3F:
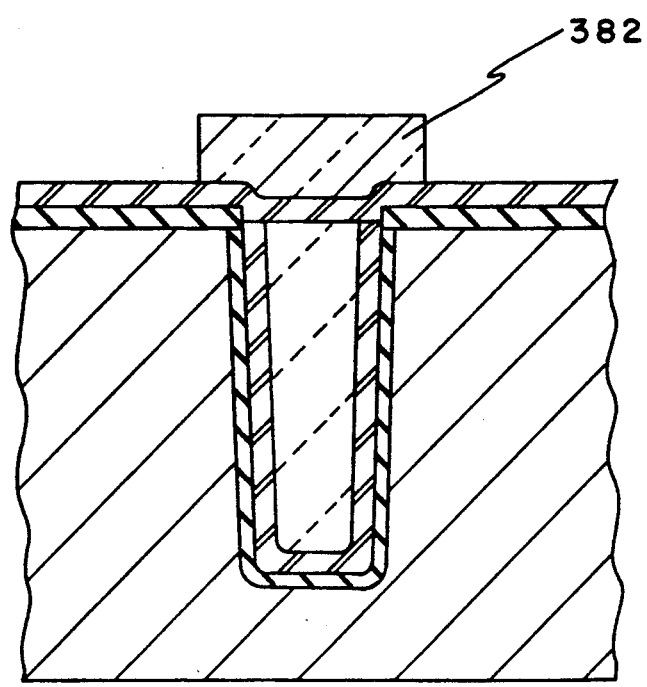

In the next step, a photoresist film 382 is formed which covers about 0.5 μm more in width than the U-groove 341 (FIG. 3F).

Figure 3G:
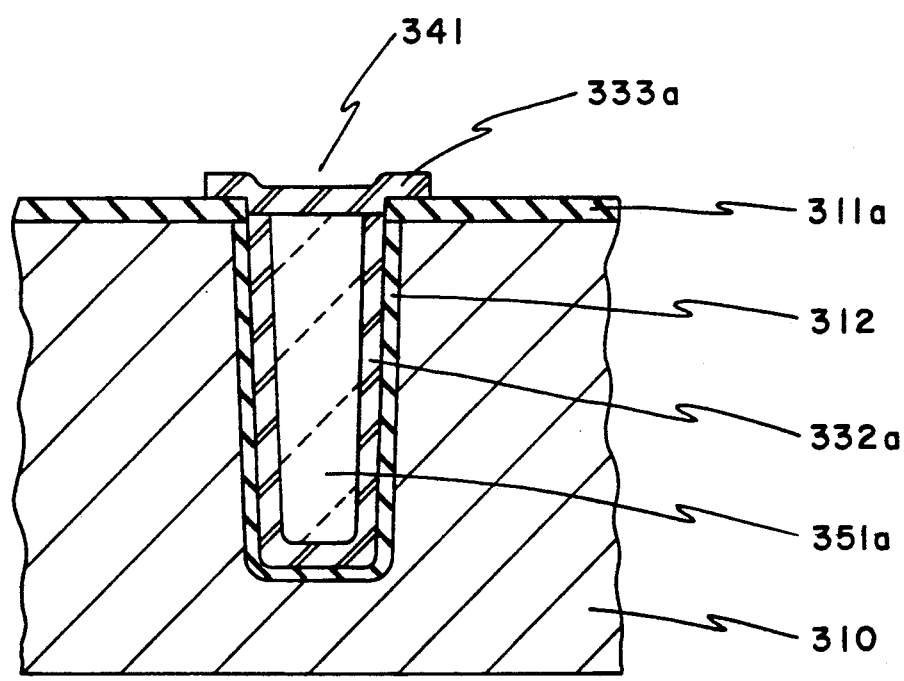

In the following steps, the silicon nitride film 333 is etched away, using the photoresist film 382 as a mask and a gas mixture of $CHF_3$ and $O_2$, by using the RIE technique. Then photoresist film 382 is removed by means of $O_2$ plasma. Thus silicon nitride film 333a is formed to cover the polysilicon 351a (FIG. 3G).

Figure 4:
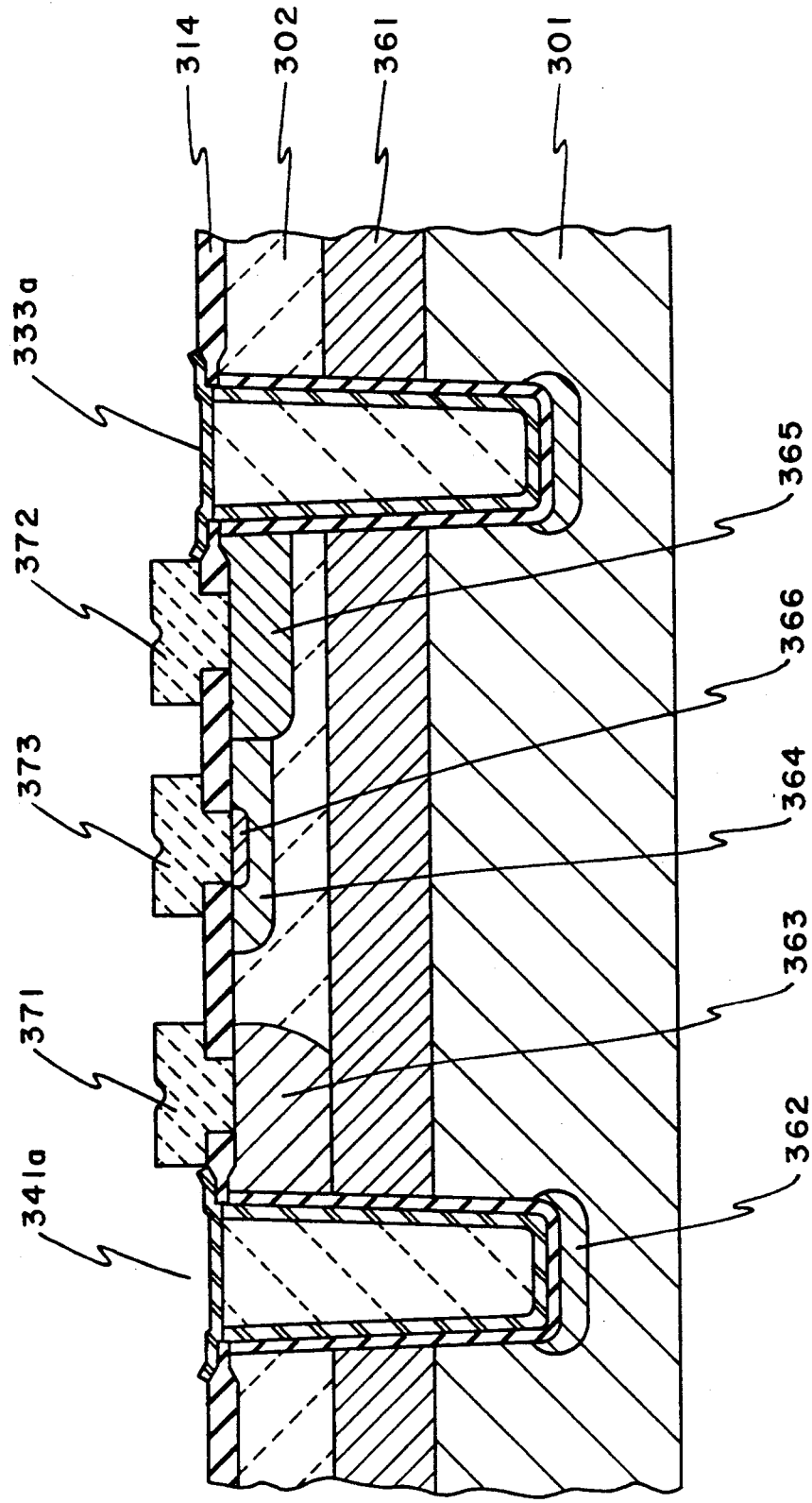
FIG. 4 is a cross-sectional view schematically illustrating a bipolar semiconductor device to which the first embodiment of the present invention is applied.
Figure 5:
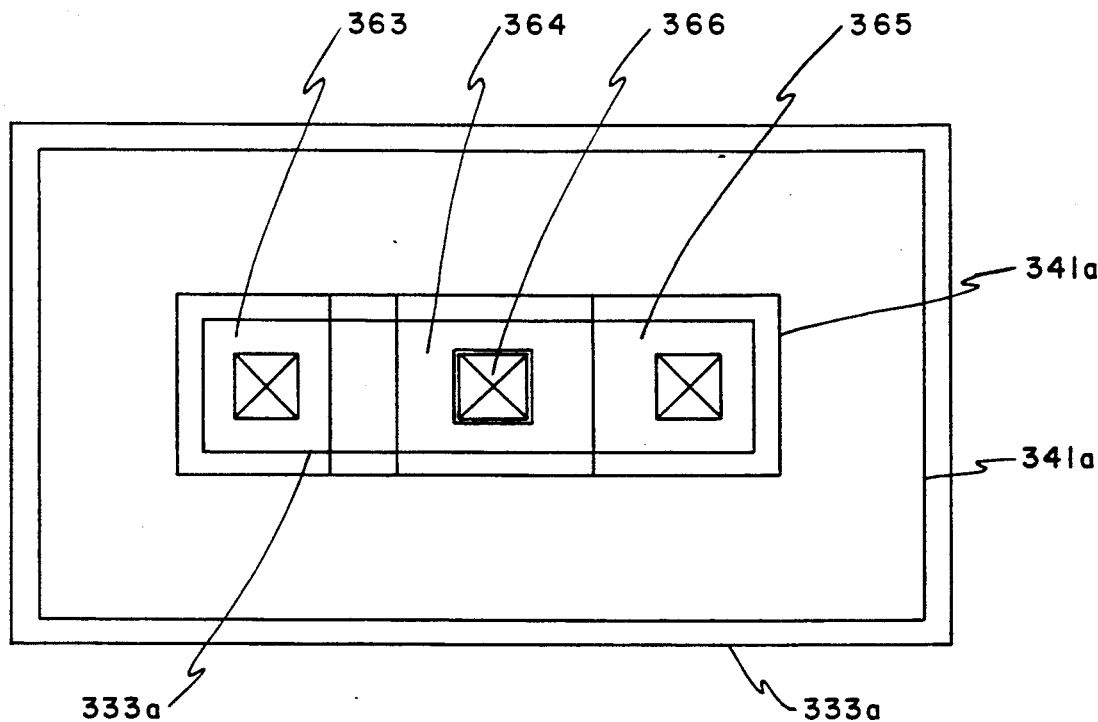
FIG. 5 is a plan view schematically illustrating the semiconductor device of FIG. 4.

FIGS. 4 and 5 are schematic diagrams in cross-sectional and plan views illustrating a bipolar semiconductor device to which the first embodiment of the present invention is applied.

This bipolar semiconductor device will be described below: In the first steps, an n+ buried layer 361 is formed on a surface of a p-type silicon body 301. Over the entire surface of this buried layer, an n-type silicon epitaxial layer 302 is grown so that a silicon substrate is constituted by the silicon body 301, the buried layer 361 and the epitaxial layer 302. Over the epitaxial layer 302, a silicon oxide film is formed by thermal oxidation.

Then sequential silicon etching of the silicon epitaxial layer 302, the n+ buried layer 361 and the silicon substrate 301 is carried out to form a U-groove 341a. A p-type channel stopper 362 is formed underneath the U-groove 341a. The surface of this U-groove is covered with an insulating film and filled with polysilicon. Besides a silicon nitride film 333a is formed covering and directly contacting the U-groove polysilicon.

Over the surface of the silicon epitaxial layer 302 is formed a thick silicon oxide film 314 in order to provide a field insulating film using silicon nitride film 333a as a mask, by using the LOCOS technique. In the following steps, an n+ collector region 363, a p-type base region 364, a p+ graft-base region 365 and an n+ emitter region 366 are formed by a conventional photolighography, ion implantation and/or diffusion technique. The collector region 363 is connected to buried layer 361. Besides a collector electrode 371, a base electrode 372 and an emitter electrode 373 are formed by a use of the usual photolithography technique then a metal wiring is applied. Thus a bipolar transistor shown in FIGS. 4 and 5 is obtained.

Figure 6:
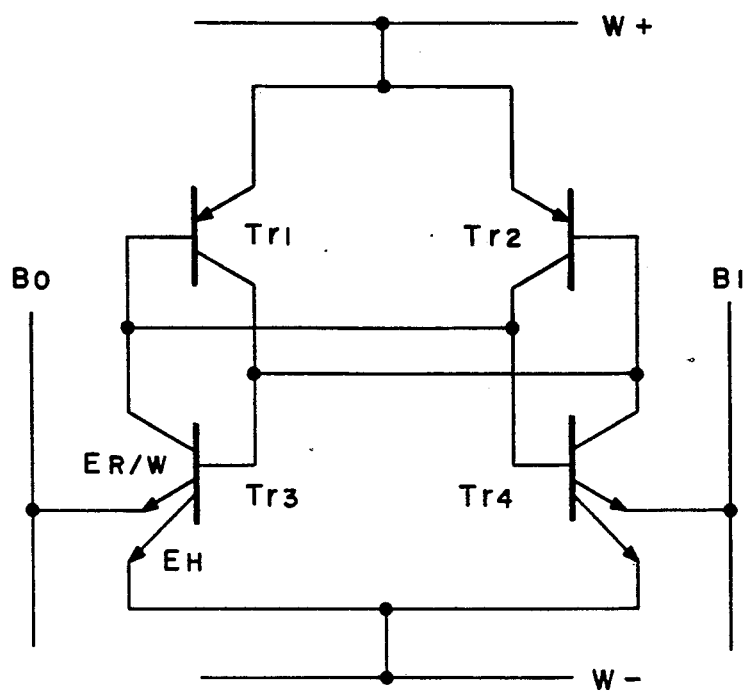
FIG. 6 is a circuit diagram illustrating an ECL RAM to which the first embodiment of the present invention is applied.

The bipolar transistor illustrated in FIGS. 4 and 5 may be a component as of an ECL RAM. FIG. 6 shows a circuit diagram of a memory cell of such a RAM. Both of the transistors $Tr_3$ and $Tr_4$ of the circuit are the bipolar transistor illustrated in FIGS. 4 and 5. In FIG. 6 the transistors, $Tr_1$ and $Tr_2$ are lateral type pnp transistors. Transistors $Tr_3$ and $Tr_4$ are vertical type npn transistors. The notation $E_{r/w}$ indicates an emitter for "read/write" and the notation E indicates an emitter for "hold". The notations W+ and W indicate the higher and lower potential side word lines, respectively. The notations $B_0B_1$ identify bit lines to which inverse electric signals are applied.

In the case where the first embodiment of the present invention is applied and thus "hold" current is set to 1.0 μA per memory cell, it is necessary to limit the leakage current to 0.1 μA or less. The leakage current per transistor must be limited to up to 0.05 μA. Unless this condition can be met, a problem is encountered, for example, in operation speed and reliability of a RAM.

Figure 7:
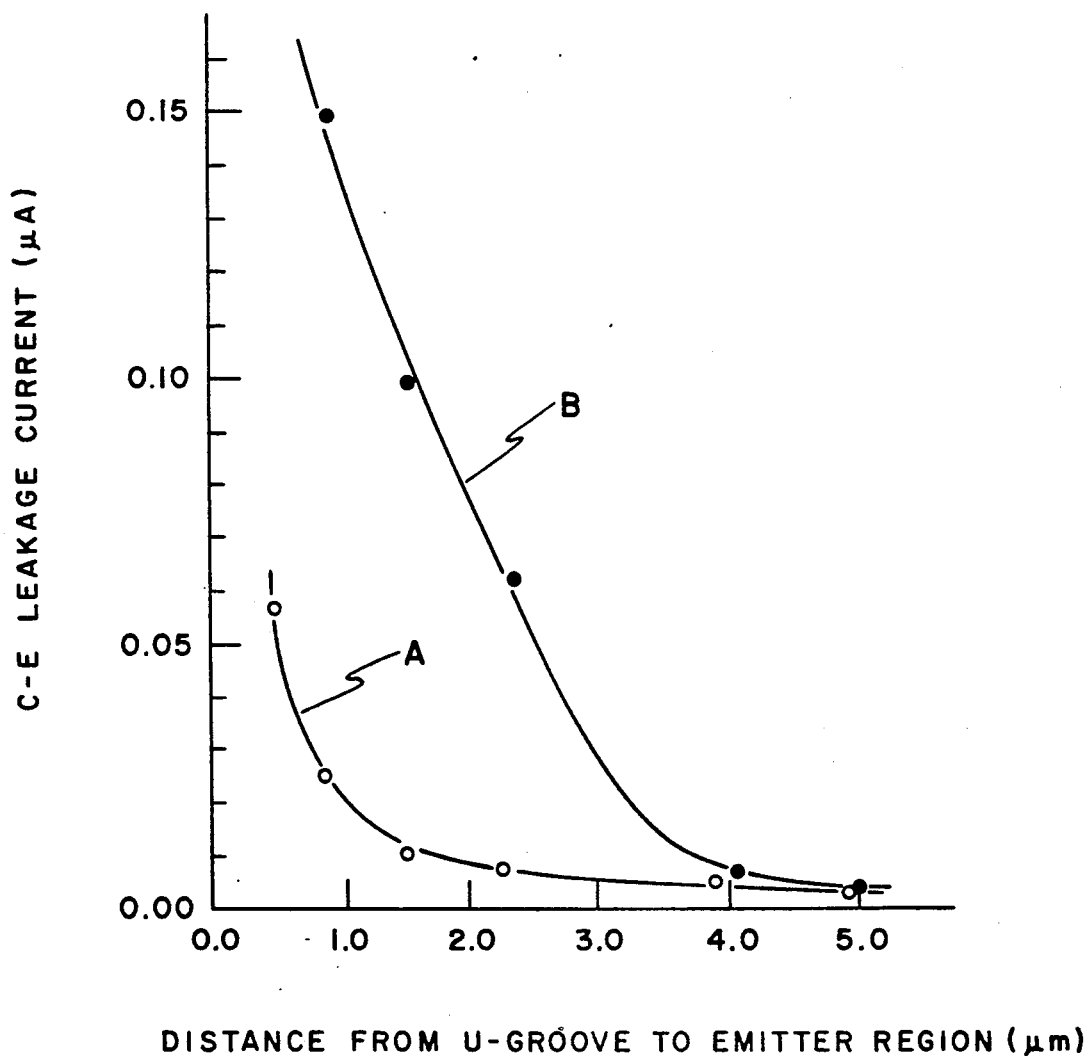
FIG. 7 is a graph of the characteristic of the bipolar semiconductor device to which the first embodiment of the present invention is applied, the graph showing the relationship of C-E leakage current to distance from U-groove to emitter region.

With the bipolar transistor illustrated in FIGS. 4 and 5, and assuming that emitter region 366 has an area of 1 μm×1 μm, the variation of leakage current studied with minimum distance from U-groove 341a to emitter region. The measured results were plotted as a graph designated A in FIG. 7. The results by a similar measurement with the prior art shown in FIG. 2 were plotted as another graph designated B.

As is apparent from these results, the application of the resent invention permits the minimum distance from the U-groove to emitter region is reduce to be about 2 μm-reduced as compared with the prior art, and thus enables memory size in an ECL RAM to be about 150 $\mu m^2$ while that in the prior art is about 300 $\mu m^2$.

Figure 8A:
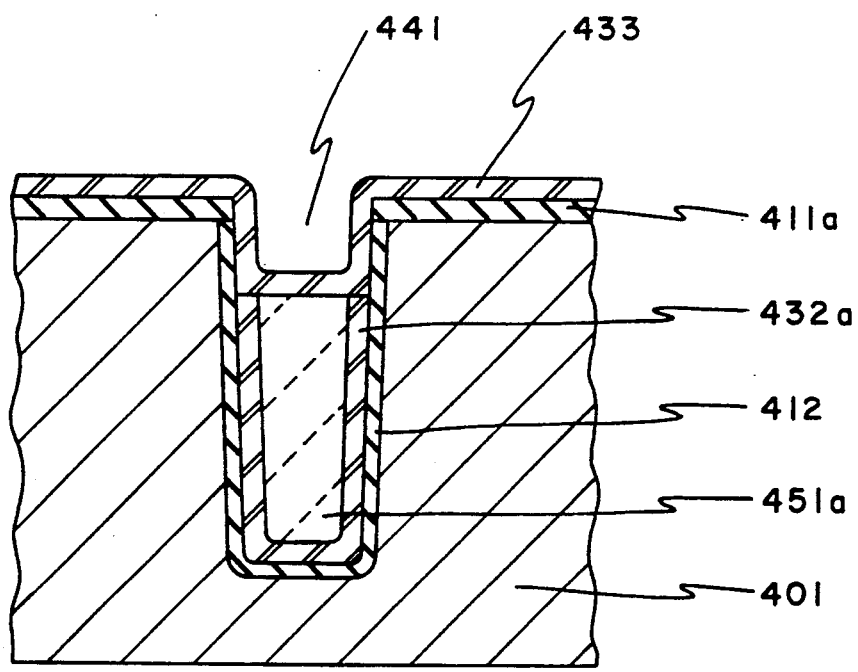
FIGS. 8A through 8C are cross-sectional views schematically illustrating a dielectric isolation region of a semiconductor device, which has a U-groove structure, as the second embodiment of the present invention, and a series of steps for forming it.
Figure 8B:
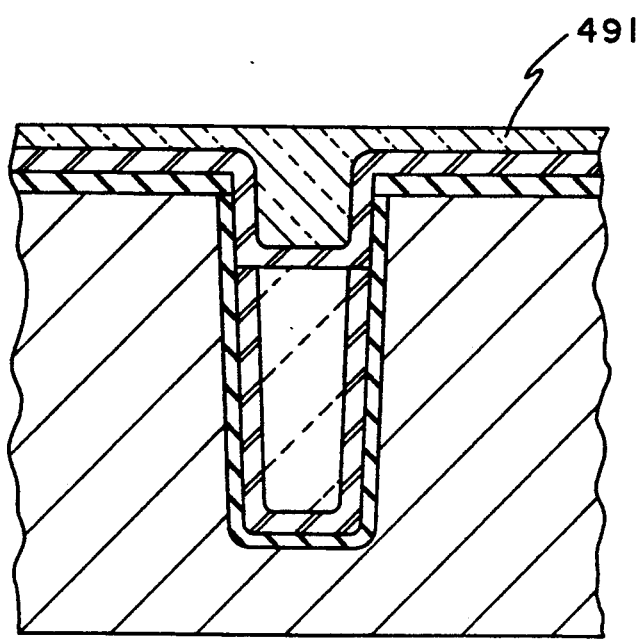
Figure 8C:
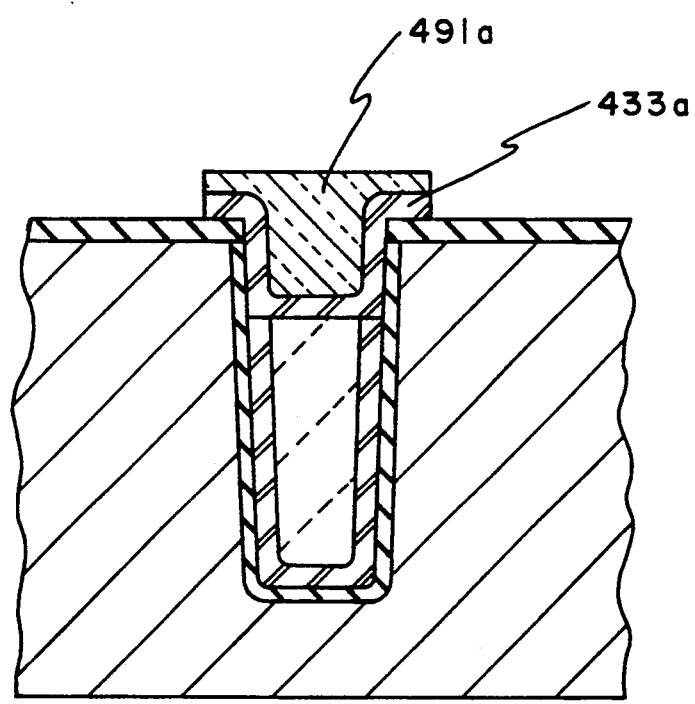

FIGS. 8A through 8C are cross-sectional views schematically illustrating a U-groove dielectric isolation region of the first semiconductor device as the second embodiment of the present invention, and a series of step of forming it.

In the first steps, a silicon oxide film is formed over the surface of a silicon substrate 401 by thermal oxidation. With the silicon oxide film and a photoresist film as masks, a U-groove 441 is formed by the RIE technique. Over the inner surface of the U-groove 441, a silicon oxide film 412 is formed by thermal oxidation. At the same time, the silicon oxide film on the surface of silicon substrate 401 becomes thicker (411a). Over the entire surface including the inner surface of the U-groove 441, a silicon nitride film, followed by a polysilicon film thereover, are deposited by LPCVD technique. Then etching is carried out to fill the U-groove 441 with polysilicon 451a to a level which is lower by about 0.1 to 0.3 μm than the upper edge of U-groove 441. The following steps are carried out in the same way as in the first embodiment: the exposed silicon nitride film is etched away, leaving the silicon nitride film 432a only on the inner surface of the U-groove 441. Over the whole surface including the surface of U-groove polysilicon 451a, a silicon nitride film 433 is directly deposited by an LPCVD technique (FIG. 8A).

In the following steps, the entire surface is coated as with a SOG (spin on glass) film 491 including PSG, by a use of a spincoating technique. Then thermal processing is carried out in a gas mixture of $N_2$ and $O_2$ at 300° C., followed by at 900° C., the SOG film 491 is sintered (FIG. 8B) thereby.

In the next step, the SOG film 491 and the silicon nitride film 433 are etched using a photoresist film (not shown) as a mask to form a silicon nitride film 433a. A SOG film 491a covers only the surface of the polysilicon 451a (FIG. 8C).

This embodiment has, in addition to the same effects as the first embodiment, the advantage of good surface flatness over the first embodiment, contributing in particular to an effective wiring of semiconductor elements. When a wiring is formed above the U-groove, the U-groove polysilicon may function as a floating gate between the wire and the semiconductor. In this embodiment, compared with the first embodiment, the U-groove polysilicon has a lowered function as the floating gate because the thickness of the insulating film separating the wiring passing above the U-groove from the U-groove polysilicon is great as compared with the thickness in the first embodiment.

Moreover in the second embodiment an alternative process may be applied which comprises forming a silicon nitride film in advance 433a, then coating with SOG by spincoating and sintering it, and finally etching the SOG film back.

Although the present invention has been described with reference to specific embodiments, this description is not meant to be construed in a limiting sense. Various modifications of the disclosed embodiment, as well as other embodiments of the present invention, will become apparent to persons skilled in the art upon reference to the description of the present invention. It is therefore contemplated that the appended claims will cover any equivalents modifications or embodiments as fall within the scope of the present invention.

What is claimed is:

1. A semiconductor device comprising:
   a semiconductor substrate having a major surface;
   a U-groove formed in said substrate and extending inwardly from said major surface said U-groove being composed of a side wall and a bottom;
   a silicon oxide film formed on and attached to all parts of said side wall and of said bottom of said U-groove;
   a first silicon nitride film formed on said silicon oxide film to cover the entire surface of said silicon oxide film in said U-groove;
   a polysilicon layer formed on said first silicon nitride film within said U-groove and entirely filling said U-groove so that said polysilicon layer forms an exposed upper surface near the level of said major surface of said substrate; and
   a second silicon nitride film attached directly to all parts of said exposed upper surface of said polysilicon layer.

2. A semiconductor device defined in claim 1, wherein
   said semiconductor substrate includes a p-type silicon substrate, an n+ buried layer over the surface of said silicon substrate and an n-type silicon epitaxial layer formed over a surface of said buried layer; and
   said U-groove extends through said epitaxial layer and said buried layer.

3. A semiconductor device as defined in claim 1 further comprising an element forming a region in said semiconductor substrate, said element forming region being surrounded by said U-groove.

4. A semiconductor device as defined in claim 3 wherein said element forming region is a region in which a bipolar transistor is formed.

5. A semiconductor device comprising:
   a semiconductor surface having a major surface;
   a first silicon oxide film formed on said major surface:
   a U-groove formed in said substrate and extending inwardly from said major surface, said U-groove being composed of a side wall and a bottom, said side wall including an upper portion extending downward from said major surface of said substrate into said U-groove and a lower portion extending upward from said bottom toward said major surface and being positioned between said bottom and said upper portion;
   a second silicon oxide film formed on and attached to all parts of said upper and lower portions of said side wall of said U-groove and to all parts of said bottom of said U-groove;
   a first silicon nitride film formed on a first section of said second silicon oxide film and having an upper end, said first section of said second silicon oxide film being positioned on said lower portion of said side wall and said bottom of said U-groove;
   a polysilicon layer formed on said first silicon nitride film within said U-groove and filling said U-groove up to said upper end of said first silicon nitride film and forming an upper surface there;
   a second silicon nitride film attached directly to all parts of said upper surface of said polysilicon layer within said U-groove and formed on a second section of said second silicon oxide film within said U-groove and on said first silicon oxide film above said major surface of said substrate, said second section of said second silicon oxide film being positioned on said upper portion of said side wall of said U-groove; and
   a glass film having an upper surface and being formed on said second silicon nitride film within said U-groove in order to fill remaining space of said U-groove and on said second silicon nitride film above said major surface of said substrate, said upper surface of said glass film being substantially co-planar from a part above said U-groove to a part above said major surface of said substrate.

6. A semiconductor device defined in claim 5, wherein
   said semiconductor substrate includes a p-type silicon substrate, an n+ buried layer over a surface of said silicon substrate, and an n-type silicon epitaxial layer over a surface of said buried layer; and
said U-groove extends through said silicon epitaxial layer and said buried layer.

7. A semiconductor device as defined in claim 5 further comprising an element forming region in said semiconductor substrate, said element forming region being surrounded by said U-groove.

8. A semiconductor device as defined in claim 7 and a bipolar region formed in said element forming region.

* * * * *